(12) United States Patent
Kwangkaew et al.

(10) Patent No.: US 9,835,716 B2
(45) Date of Patent: Dec. 5, 2017

(54) PROXIMITY SENSOR WITH LIGHT BLOCKING COMPOUND

(71) Applicants: Vanapong Kwangkaew, Wang Noi (TH); Krisadayut Chansawang, Nungkhangpoo (TH); Sirirat Silapapipat, Ladroad (TH); Preecha Bootwicha, Saimai (TH); Sanjay Mitra, Colorado Springs, CO (US)

(72) Inventors: Vanapong Kwangkaew, Wang Noi (TH); Krisadayut Chansawang, Nungkhangpoo (TH); Sirirat Silapapipat, Ladroad (TH); Preecha Bootwicha, Saimai (TH); Sanjay Mitra, Colorado Springs, CO (US)

(73) Assignee: Hana Microelectronics, Inc., Santa Clara, CA (US)

( * ) Notice: Subject to any disclaimer, the term of this patent is extended or adjusted under 35 U.S.C. 154(b) by 0 days.

(21) Appl. No.: 15/261,813

(22) Filed: Sep. 9, 2016

(65) Prior Publication Data

US 2017/0067986 A1    Mar. 9, 2017

Related U.S. Application Data

(63) Continuation of application No. 14/668,805, filed on Mar. 25, 2015, now Pat. No. 9,632,209.

(51) Int. Cl.
*G01J 5/00* (2006.01)
*G01S 7/481* (2006.01)
*G01V 8/12* (2006.01)
*H05K 3/30* (2006.01)
*G01S 17/02* (2006.01)
*H05K 3/28* (2006.01)

(52) U.S. Cl.
CPC .......... *G01S 7/4813* (2013.01); *G01S 17/026* (2013.01); *G01V 8/12* (2013.01); *H05K 3/30* (2013.01); *H05K 3/284* (2013.01); *H05K 2201/10106* (2013.01); *H05K 2201/10151* (2013.01)

(58) Field of Classification Search
CPC .............................. G01S 7/4813; G01S 17/026
USPC .............................. 250/338.1, 339.06, 341.1
See application file for complete search history.

(56) References Cited

U.S. PATENT DOCUMENTS

| 8,716,665 B2 * | 5/2014 | Yao ........................ G01S 7/4813 250/338.1 |
| 9,632,209 B2 * | 4/2017 | Kwangkaew .......... H05K 3/284 |
| 2015/0330772 A1 * | 11/2015 | Charusabha ........... H05K 3/284 250/353 |

* cited by examiner

*Primary Examiner* — David Porta
*Assistant Examiner* — Meenakshi Sahu
(74) *Attorney, Agent, or Firm* — West & Associates, a PC; Stuart J. West (57) ABSTRACT

A sensor comprising a light emitter and light detector directly covered and encapsulated by a layer of light blocking compound. The light blocking compound can be thick enough between the light emitter and light detector to block substantially all light emitted by the light emitter from reaching the light detector directly, but be thin enough above the light emitter and light detector to allow at least some level of light emitted by the light emitter to escape out of the sensor, be reflected by another object, re-enter the sensor, and survive passing through the light blocking compound to enter the light detector.

1 Claim, 7 Drawing Sheets

Prior Art

FIG. 1

Prior Art

PROXIMITY SENSOR WITH LIGHT BLOCKING COMPOUND

BACKGROUND

Field of the Invention

The present disclosure relates to proximity, color, gesture, and/or motion sensors, particularly optical sensors having a molded or cast infrared light blocking compound.

Background

Proximity, color, gesture, and motion sensors are often used in a variety of devices, including mobile phones, personal media players, tablet computers, laptop computers, amusement and vending machines, industrial machinery, contactless switches, automated sanitary machinery, and other devices. By way of a non-limiting example, some mobile phones incorporate a proximity sensor near the mobile phone's touchscreen so that the screen can be turned off to save power and to avoid unwanted touch inputs when the mobile phone is being used and a user's head is near to the screen or is touching the screen.

Figure 1:
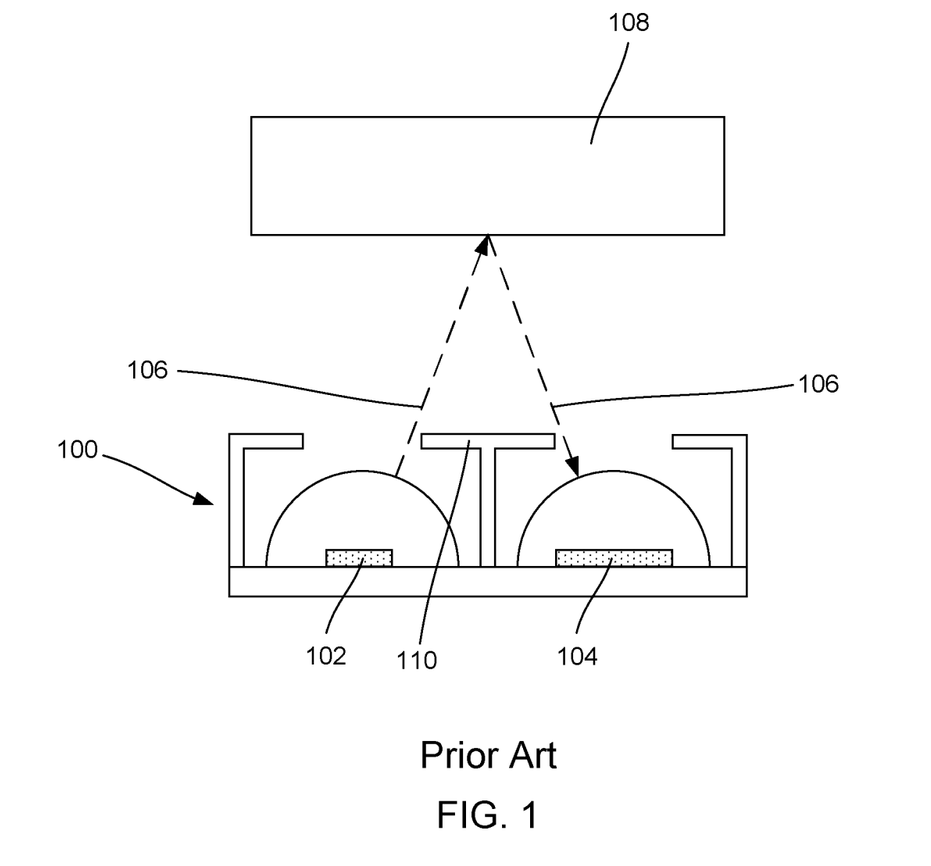
FIG. 1 depicts a first prior art proximity sensor.

FIG. 1 depicts a prior art optical proximity sensor 100. Optical proximity sensors 100 can comprise one or more light emitters 102 and one or more light detectors 104. In some embodiments, the light emitters 102 can be light emitting diodes (LEDs) that emit infrared light, and the light detectors 104 can be photodiodes configured to detect infrared light. As can be seen from FIG. 1, when an object 108 is located proximate to the optical proximity sensor 100, infrared light 106 emitted by the light emitter 102 can be reflected off of the object 108 and be directed back toward the light detector 104. The reflected rays of infrared light 106 can be detected by the light detector 104, which can provide an indication that the object 108 is proximate to the optical proximity sensor 100, and/or can provide information about the motion of the object 108 relative to the optical proximity sensor 100 such that the optical proximity sensor 100 can act as a motion sensor or gesture sensor.

Crosstalk can be undesirable interactions between the light emitters 102 and light detectors 104 in optical proximity sensors 100. Crosstalk can occur when light travels directly or indirectly from the light emitter 102 to the light detector 104 without being reflected off of a nearby object 108, thereby leading to false positives in motion or proximity detection. To decrease the level of crosstalk between the light emitters 102 and light detectors 104, many optical proximity sensors 100 have one or more blocking components 110 placed or formed between the light emitters 102 and light detectors 104 to block at least some non-reflected light transmission between the light emitters 102 and the light detectors 104.

In many optical proximity sensors 100, the blocking component 110 can be a shield, such as a metal shield or a shield of any other material that blocks the transmission of infrared light. Shields are often manufactured separately, and are placed between the light emitter 102 and light detector 104 during assembly of the optical proximity sensor 100, as shown in FIG. 1. However, the use of a separately manufactured metal shield can add manufacturing expenses due to the materials cost of the metal or other infrared-blocking material, the often small size of the shields, and the cost of custom machinery to form the shield and to place the shield during assembly. Additionally, the shield can be dented or deformed during use, or can come loose and be displaced from the rest of the optical proximity sensor 100. As the placement and structural form of the blocking component 110 can be important in inhibiting light transfer in certain directions to limit crosstalk, deformation or displacement of the shield can lead to decreased performance of the optical proximity sensor 100 by allowing higher levels of crosstalk.

Figure 2:
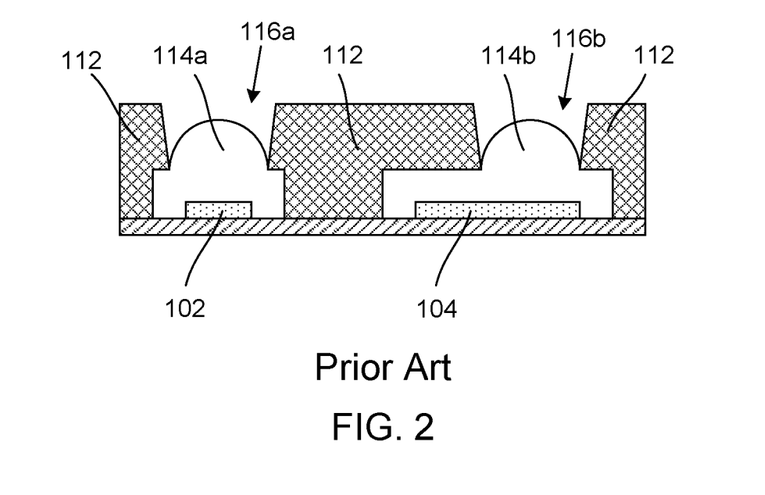
FIG. 2 depicts a second prior art proximity sensor made with a double mold process.

In other optical proximity sensors 100, the blocking component 110 can be a light blocking compound 112 that blocks transmission of substantially all light within a particular spectrum through the light blocking compound 112, as shown in FIG. 2. Optical proximity sensors 100 that comprise light blocking compounds 112 have traditionally been formed using a double mold process in combination with light transmissive compounds 114 that allow the transmission of substantially all light within a particular spectrum.

In a double mold manufacturing process, light transmissive compounds 114 are first encapsulated over a light emitter 102 and light detector 104. The light transmissive compounds 114 are molded over and around the light emitter 102 and light detector 104, and are allowed to cure. After the light transmissive compounds 114 have cured, the light blocking compound 112 is molded over and around the light transmissive compounds, filling a space between the light emitter 102 and light detector 104 as shown in FIG. 2, such that light emitted by the light emitter 102 will be blocked by the light blocking compound 112 from passing directly to the light detector 104. The light blocking compound 112 is generally molded to leave apertures 116 above the light emitter 102 and light detector 104, such that light emitted by the light emitter 102 can pass through the light transmissive component 114a encapsulating the light emitter 102, exit the proximity sensor 100 through the aperture 116a above the light emitter 102, be reflected by an external object 108, re-enter the proximity sensor 100 through the aperture 116b above the light detector 104, pass through the light transmissive component encapsulating the light detector 104, and finally enter the light detector 104 itself to be detected.

However, this double mold process can be expensive due to the need to use two different types of molding compounds. It can also take a long time, because the light transmissive compounds 114 must first be molded and allowed to cure over the light emitter 102 and light detector 104, and only then can the light blocking compounds 112 be molded over the previously molded light transmissive compounds 114. Additionally, special molds must be made and used to form apertures 116 that keep the light blocking compound 112 from completely covering the light transmissive compounds 114.

What is needed is an a sensor with a layer of light blocking compound directly covering and encapsulating a light emitter and light detector, such that the light blocking compound blocks crosstalk between the light emitter and light detector, but does not fully block transmission of light out of and into the sensor.

DETAILED DESCRIPTION

Figure 3:
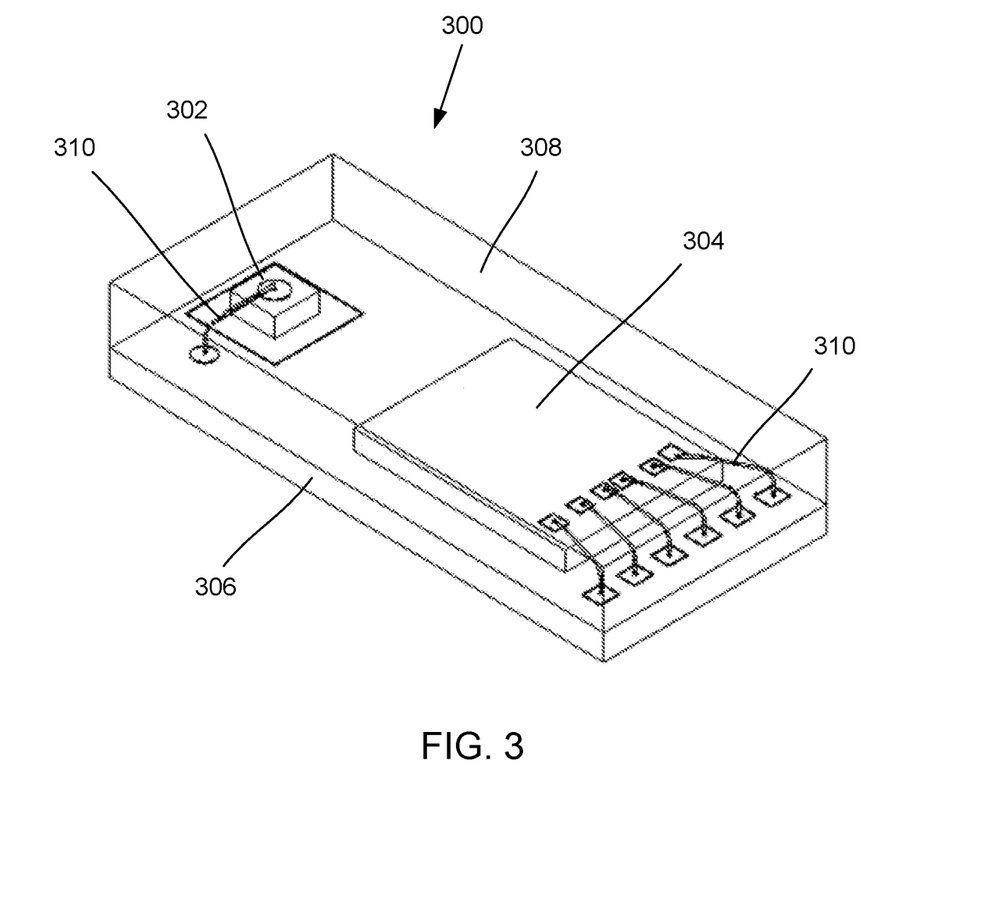
FIG. 3 depicts an embodiment of a sensor comprising a light blocking compound directly covering a light emitter and a light detector.

FIG. 3 depicts an angled view of an embodiment of a sensor 300. The sensor 300 can be a proximity sensor, color sensor, gesture sensor, and/or motion sensor that detects nearby objects, motion of objects, light intensity, and/or light color. The sensor 300 can comprise a light emitter 302, a light detector 304, a base 306, and a light blocking compound 308.

The light emitter 302 can be a light source configured to emit light. In some embodiments, the light emitter 302 can be an emitter die configured to emit infrared light. By way of a non-limiting example, in some embodiments the light emitter 302 can be an infrared light emitting diode (IR LED). In alternate embodiments the light emitter 302 can be an emitter die configured to emit light at any desired wavelength or range of wavelengths within the electromagnetic spectrum. The light emitter 302 can be a bare die, prepackaged die, and/or any other type of die.

The light detector 304 can be a photodiode or other light detector configured to detect light entering the light detector 304. In some embodiments, the light detector 304 can be configured to detect infrared light. By way of a non-limiting example, in some embodiments the light detector 304 can be an infrared-responding photodiode or a die configured to detect infrared light. In alternate embodiments the light detector 304 can be configured to detect light at any desired wavelength or range of wavelengths within the electromagnetic spectrum. In some embodiments, a light detector 304 can comprise an integrated circuit configured to detect direct or reflected light entering the light detector 304.

The light emitter 302 and light detector 304 can each be mounted on different locations on the base 306. The base 306 can be a printed circuit board (PCB) or other substrate upon which other components of the sensor 300 can be mounted. In some embodiments the base 306 can comprise conductive elements such as a lead frame, individual leads, and/or metal trace input/output components. By way of a non-limiting example, in some embodiments the base 306 can have conductive elements comprising copper alloy. In other embodiments, the base 306 can have conductive elements comprising other types of conductive metal, metal alloys, or other conductive material, such as copper, ferrous alloys, nickel, cobalt, chromium, nickel alloys, silver, and/or gold, or any other conductive material.

Components of the sensor 300, such as the light emitter 302 and light detector 304, can be electrically coupled with conductive elements of the base 306 using wirebonding 310, conductive solder, or other electrical connections. The sensor 300 can also be electrically coupled with other one or more other components as part of a larger device by connecting them to the conductive elements of the base 306. By way of a non-limiting example, the sensor 300 can be installed within a larger device such as a mobile phone by connecting electrically conductive leads of the base 306 to electrically conductive components of the mobile phone.

In some embodiments the base 306 can further comprise non-conductive elements positioned between some or all conductive elements, such as epoxy molding compounds, organic material, and/or any other desired material. By way of non-limiting examples, the base 306 can comprise a laminated substrate such as an FR-4 epoxy-based laminate or a resin-based BT (Bismaleimide-Triazine) epoxy.

The structure formed by the light emitter 302, light detector 304, and the base 306 can be directly covered with a layer of a light blocking compound 308 to encapsulate the light emitter 302 and light detector 304 within the light blocking compound 308. The light blocking compound 308 can comprise an optically non-transmissive material that blocks the transmission of some or all of a spectrum of light through the optically non-transmissive material. By way of a non-limiting example, the light blocking compound 308 can be configured to block some or all transmission of infrared light through the light blocking compound 308. In some embodiments, the light blocking compound 308 can comprise an infrared-blocking, filtering, or cutting transfer molding epoxy compound, such as a black molding compound. By way of a non-limiting example, the light blocking compound 308 can be compound NT8500IRD. In other embodiments, the light blocking compound 308 can comprise an infrared filter optoelectronic epoxy, or other optically non-transmissive epoxies, plastics, polymers, or other material. By way of a non-limiting example, the light blocking compound 308 can be a casting of NT8038A, NT8038B, and NTMBIRL3801.

The light blocking compound 308 can be molded or cast directly over the entirety of the structure formed by the base 306, light emitter 302, and light detector 304. Because the light emitter 302 and light detector 304 are mounted on different locations on the base 306, the light blocking compound 308 can fill the space between the light emitter 302 and the light detector 304 above the base 306.

Figure 4:
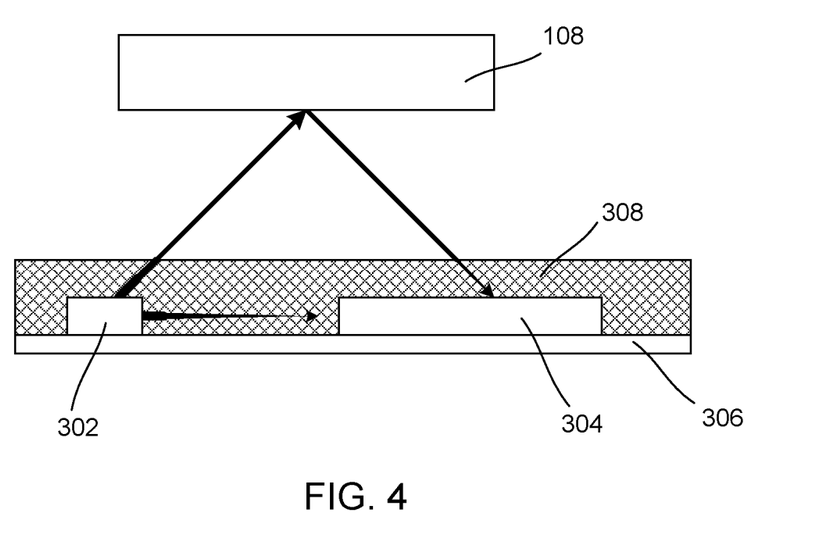
FIG. 4 depicts a side view of a cross section of a sensor comprising a light blocking compound directly covering a light emitter and a light detector.

As shown in FIG. 4, although the light blocking compound 308 directly covers the light emitter 302 and light detector 304, the light blocking compound 308 can be formed to be thin enough over the light emitter 302 and light detector 304 such that at least some level of light emitted by the light emitter 302 survives passing through the light blocking compound 308 and escapes the sensor 300, such that it can be reflected by an object 108 back into the sensor 300 and pass through the light blocking compound 308 again with enough light surviving at a level sufficient to be detected by the light detector 304. The light detector 304 can be configured to detect such a decreased level of the originally emitted light level as a positive when detecting proximity, motion, gestures, or color.

By way of a non-limiting example, in some embodiments the light blocking compound 308 can filter out approximately 80% of infrared light per 0.3 millimeter of thickness. In this non-limiting example, the light blocking compound 308 can be formed to be approximately 0.15 millimeters thick directly above the light emitter 302 and light detector 304, such that approximately 60% of the infrared light emitted by the light emitter 302 can survive passing through the light blocking compound 308. A percentage of that surviving infrared light can pass through the surrounding air, be reflected by an object, and pass back into the sensor 300. The remaining percentage of infrared light that re-enters the sensor 300 can again be filtered by approximately 40% when passing through the light blocking compound 308 above the light detector 304. However, despite being filtered by the light blocking compound 308 both while passing out of the sensor 300 and re-entering the sensor 300, enough of the original infrared light emitted by the light emitter 302 can survive to be detected by the light detector 304.

Also as shown in FIG. 4, the light emitter 302 and light detector 304 can be spaced far enough apart on the base 306 that the thickness of the light blocking compound 308 directly between the light emitter 302 and light detector 304 is large enough to filter or block substantially all of the light emitted by the light emitter 302 from reaching the light detector 304 directly, thereby reducing or substantially eliminating crosstalk. The thickness of the light blocking compound 308 between the light emitter 302 and light detector 304 can therefore be greater than the thickness of the light blocking compound 308 above the light emitter 302 and light detector 304. Continuing with the non-limiting example discussed above in which the light blocking compound 308 filters out approximately 80% of infrared light per 0.3 millimeter of thickness, the light emitter 302 and light detector 304 can be spaced approximately a millimeter apart on the base 306, such that substantially all the infrared light emitted by the light emitter 302 is filtered out by the light blocking compound 308 as the light passes straight from the light emitter 302 toward the light detector 304, and the infrared light does not reach the light detector 304 directly from the light emitter 302 at a level sufficient to be detected. As shown in FIG. 4, although light can be substantially blocked or filtered out by the light blocking compound 308 when traveling directly from the light emitter 302 to the light detector 304, light originating from the light emitter 302 can indirectly reach the light detector 304 when it is reflected off an exterior object 108 even though the light is partially filtered by the light blocking compound 308 both when exiting the sensor 300 and re-entering the sensor 300.

Figure 5:
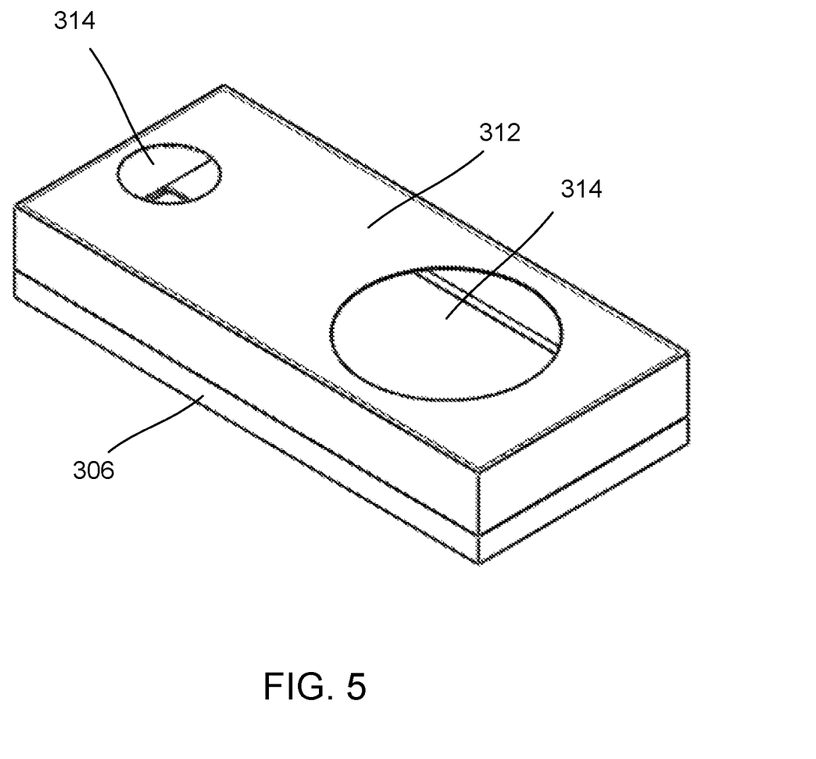
FIG. 5 depicts an embodiment of a sensor with an opaque exterior shell.

Although in some embodiments the sensor's exterior can be formed by the light blocking compound 308 and the base 306 and can be otherwise uncovered, in some other embodiments the sensor's top and/or sides can be substantially covered with an opaque light blocking material 312, as shown in FIG. 5. The opaque light blocking material 312 can be configured to block or filter transmission of the same type of light blocked by the light blocking compound 308. By way of a non-limiting example, the opaque light blocking material 312 can be compound GE100LFCG. The opaque light blocking material 312 can be formed with apertures 314 above the light emitter 302 and light detector 304, as shown in FIG. 5. In some embodiments, the opaque light blocking material 312 can be a compound cast or molded around the sensor 300. In alternate embodiments, the opaque light blocking material 312 can be a shield or shell separately manufactured and installed over and around the rest of the sensor 300.

In embodiments with the additional opaque light blocking material 312 around the exterior of the sensor 300, the opaque light blocking material 312 can block or inhibit most light originating from sources outside the sensor 300 from entering the sensor 300, passing through the layer of light blocking compound 308, and reaching the light detector 304. However, the apertures 314 in the opaque light blocking material can still allow light from the light emitter 320 that survives passing through the light blocking compound 308 to exit the sensor 300 through one aperture 314 and reflected light to re-enter the sensor 300 through the other aperture 314 to pass through the light blocking compound 308 and be detected by the light detector 304.

Figure 6:
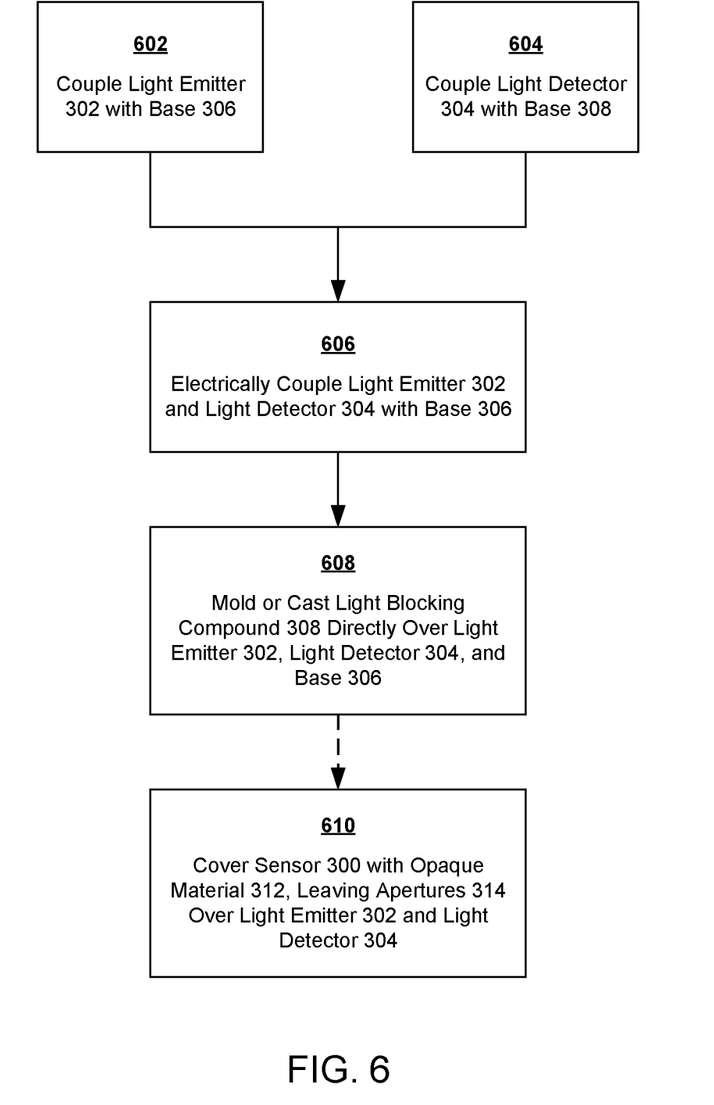
FIG. 6 depicts a process for manufacturing a sensor comprising a light blocking compound directly covering a light emitter and a light detector.

FIG. 6 depicts steps of a process for making a sensor 300 with a layer of light blocking compound 308 directly covering a light emitter 302 and a light detector 304. At steps 602 and 604, a light emitter 302 and a light detector 304 can be mounted on different location on the base 306. By way of non-limiting examples, the light emitter 302 and light detector 304 can each be mounted to the top of the base 306 using adhesives, screws, bolts, solder, or any other coupling mechanism. As discussed above, the light emitter 302 and light detector 304 can be spaced apart on the base at a distance such that a light blocking compound 308, later placed between the light emitter 302 and light detector 304 in step 608, will block or filter out substantially all light travelling directly toward the light detector 304 from the light emitter 302 before it reaches the light detector 304.

Figure 7A:
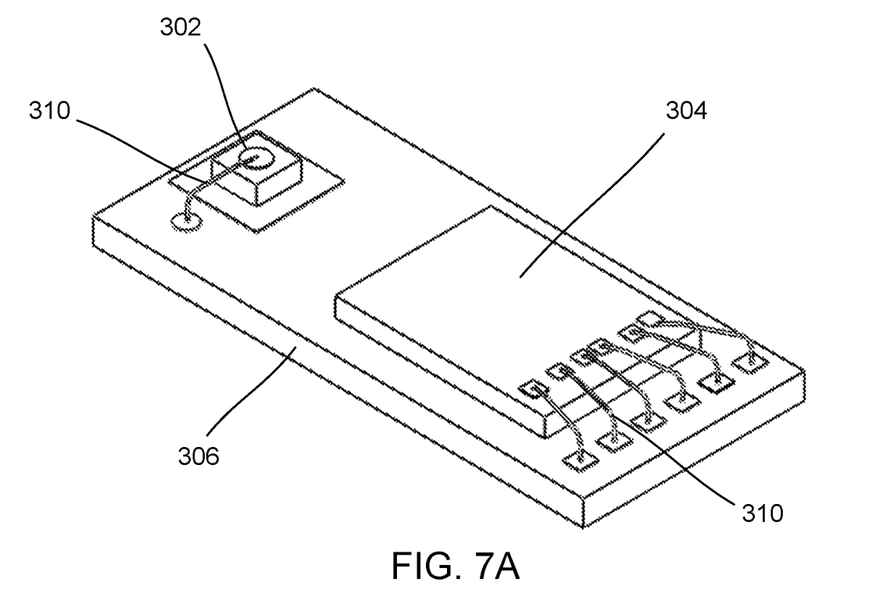
FIGS. 7A-7C depict views of a sensor as it is being manufactured according to the steps of FIG. 6.

At step 606, the light emitter 302 and light detector 304 can be electrically coupled with conductive elements of the base 306. By way of a non-limiting example, wirebonding 310 can be used to separately connect the light emitter 302 and the light detector 304 to the base 306. FIG. 7A shows an example of the state of a partially manufactured sensor 300 after step 606.

At step 608, a layer of light blocking compound 308 can be molded or cast over the structure formed by the light emitter 302, light detector 304, and base 306, to encapsulate the light emitter 302 and light detector 304 within the light blocking compound 308. By way of a non-limiting example, the light blocking compound 308 can be molded over the light emitter 302, light detector 304, and base 306 using a transfer molding machine or any other suitable molding device. The light blocking compound 308 can directly cover the tops and sides of the light emitter 302 and light detector 304, and can fill the space between the light emitter 302 and light detector 304 above the base 306. The layer of light blocking compound 308 can be formed to be thin enough above the light emitter 302 and light detector 304 such that at least some level of light from the light emitter 302 can survive passing through the light blocking compound 308 and some level of reflected light can survive passing through the light blocking compound 308 into the light detector 304. The light blocking compound 308 can be allowed to cure.

Figure 7B:
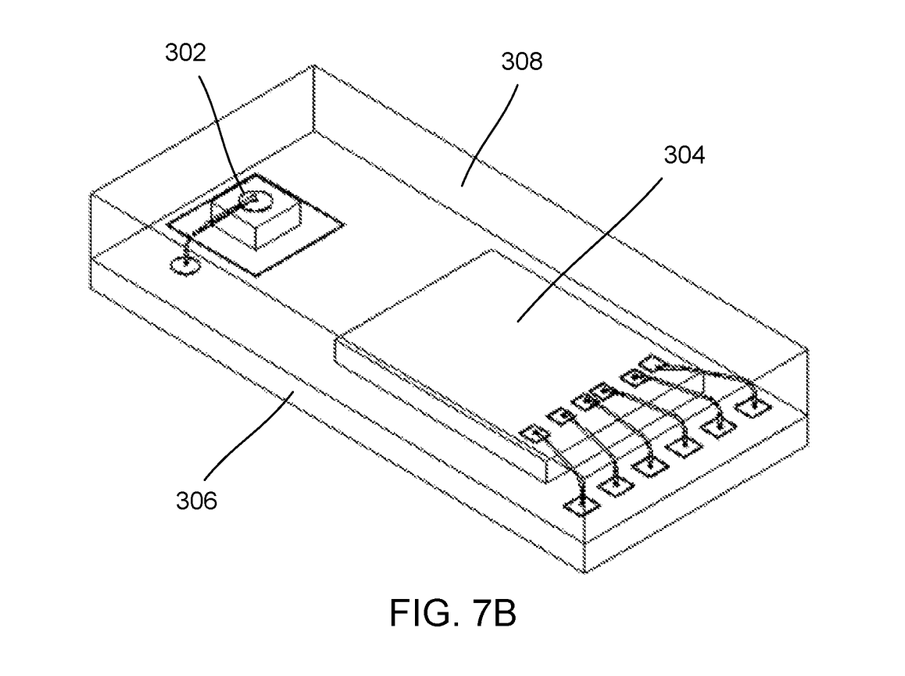
Figure 7C:
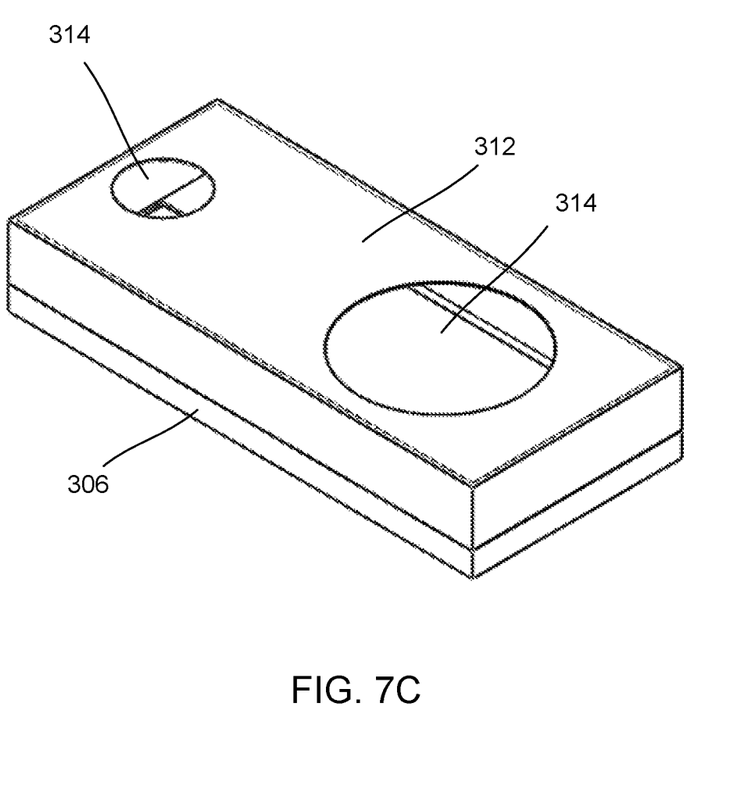

In some embodiments, the process can end after step 608 and the manufacturing of the sensor 300 can be complete as shown in FIG. 7B. However, in other embodiments the process can continue to step 610, during which opaque light blocking material 312 can be molded, cast, or placed around the sides and top of the sensor 300 as shown in FIG. 7C. The opaque light blocking material 312 can be in direct contact with the exterior of the cured light blocking compound 308. The opaque light blocking material 312 can be formed with two apertures 314, with one being positioned above the light emitter 302 and one being positioned above the light detector 304.

In some embodiments a single sensor 300 can be manufactured with the process of FIG. 6. In other embodiments, a sheet of contiguous sensors 300 can be manufactured according to the steps of FIG. 6, and the sheet of contiguous sensors 300 can be singulated with a precision saw machine, metal stamping machine, or any other desired method to separate out individual sensors 300. By way of a non-limiting example, a large sheet of continuous bases 306 can be provided, and sets of light emitters 302 and light detectors 304 can be mounted to and electrically coupled with the bases 306 within the sheet. A layer of light blocking compound 308 can be molded or cast over the sheet, directly covering each pair of light emitters 302 and light detectors 304. After the light blocking compound 308 has cured over the entire sheet, the sheet can be singulated to separate out individual sensors 300.

Although the invention has been described in conjunction with specific embodiments thereof, it is evident that many alternatives, modifications and variations will be apparent to those skilled in the art. Accordingly, the invention as described and hereinafter claimed is intended to embrace all such alternatives, modifications and variations that fall within the spirit and broad scope of the appended claims.

What is claimed is:

1. A sensor, comprising:

an infrared light emitter mounted on a first position on a base;

an infrared light detector mounted on a second position on said base; and a layer of infrared light blocking compound above said base, such that said infrared light blocking compound directly covers and encapsulates said infrared light emitter and said infrared light detector, wherein said infrared light blocking compound has a first thickness above said infrared light emitter at which infrared light emitted by said infrared light emitter towards the top of said light blocking compound at least partially survives passing through said infrared light blocking compound, and wherein said infrared light blocking compound has a second thickness between said infrared light emitter and said infrared light detector that is larger than said first thickness, such that said infrared light blocking compound blocks transmission of substantially all infrared light traveling directly from said infrared light emitter to said infrared light detector.

* * * * *